(12) United States Patent
Ueda et al.

(10) Patent No.: US 6,337,259 B1
(45) Date of Patent: Jan. 8, 2002

(54) METHOD FOR FABRICATING SEMICONDUCTOR DEVICE WITH HIGH QUALITY CRYSTALLINE SILICON FILM

(75) Inventors: Tohru Ueda; Yasumori Fukushima; Yoshinori Higami, all of Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/579,440

(22) Filed: May 26, 2000

(30) Foreign Application Priority Data

May 27, 1999 (JP) ............................................ 11-148173

(51) Int. Cl.[7] ............................................ H01L 21/322
(52) U.S. Cl. ...................... 438/471; 438/660; 438/486; 438/166
(58) Field of Search ................. 438/471, 660, 438/657, 476, 658, 659, 486, 482, 166

(56) References Cited

U.S. PATENT DOCUMENTS 6,140,166 A * 10/2000 Ohtani et al. ............... 438/166

FOREIGN PATENT DOCUMENTS

| JP | 7-192998 A | 7/1995 |
| JP | 10-223533 A | 8/1998 |

* cited by examiner

*Primary Examiner*—Caridad Everhart
(74) *Attorney, Agent, or Firm*—Nixon & Vanderhye P.C.

(57) ABSTRACT

An amorphous silicon film is deposited on a quartz substrate, and a metal of Ni is introduced into the amorphous silicon film so that the amorphous silicon film is crystallized. Phosphorus is ion-implanted with an oxide pattern used as a mask. A heating process is performed in a nitrogen atmosphere, by which Ni is gettered. A heating process is performed in an $O_2$ atmosphere, by which Ni is gettered into the oxide. Like this, by performing the first gettering in a non-oxidative atmosphere, the Ni concentration can be reduced to such a level that oxidation does not cause any increase of irregularities or occurrence of pinholes. Thus, in a second gettering, enough oxidation can be effected without minding any increase of irregularities and occurrence of pinholes, so that the Ni concentration can be reduced to an extremely low level. Also, a high-quality crystalline silicon film free from surface irregularities and pinholes can be obtained.

18 Claims, 7 Drawing Sheets

↑ DIRECTION OF GETTERING

↑ DIRECTION OF GETTERING

DIRECTION OF GETTERING

DIRECTION OF GETTERING

↑ DIRECTION OF GETTERING

METHOD FOR FABRICATING SEMICONDUCTOR DEVICE WITH HIGH QUALITY CRYSTALLINE SILICON FILM

BACKGROUND OF THE INVENTION

The present invention relates to a method for fabricating semiconductor devices and, more particularly, a method for fabricating a TFT (Thin Film Transistor) using crystalline silicon film as an active region.

TFTs using crystalline silicon film as an active region have been widely used for active matrix type liquid crystal devices, contact type image sensors and the like. Further, in recent years, these devices have been increasingly growing toward higher resolutions, and what is more, there has been made an attempt to build in, on the same board, not only driver circuits but also IC (Integrated Circuit) functions of control circuits, data processing circuits and the like that have been externally provided in the prior arts. For these reasons, TFTs are demanded to attain further enhancement in performance (higher-speed operations, lower leak current and lower-voltage operations).

Also, by enhancing the TFT performance up to an equivalency to MOS (Metal Oxide Semiconductor) transistors of single crystal silicon, it becomes possible to achieve newly functioned devices and so-called 3D ICs, which take advantage of characteristics as SOI (Silicon On Insulator). Like this, for enhancement in TFT performance, it is indispensable to achieve higher qualities of crystalline silicon films constituting the active region, i.e., scale-up of crystal grains, improvement in orientation characteristics, reduction in defect density and reduction in impurities.

Conventionally, as a method for achieving higher qualities of crystalline silicon films, there has been used a method in which a metallic element serving for acceleration of crystallization is introduced into an amorphous silicon film formed on an insulating substrate so that amorphous silicon is crystallized, and thereafter the metallic element is removed or reduced by gettering process. Such methods for achieving higher qualities of crystalline silicon films are disclosed in, for example, Japanese Patent Laid-Open Publications HEI 7-192998 and HEI 10-223533. These are described below in detail and separately.

(A) Japanese Patent Laid-Open Publication HEI 7-192998

Figure 6A:
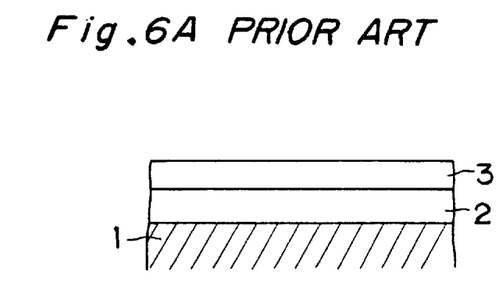
FIGS. 6A to 6F are views showing a prior art method for crystallization of an amorphous silicon film as well as gettering of a metallic element.

After a metallic element serving for acceleration of crystallization is introduced into an amorphous silicon film so that the amorphous silicon film is crystallized, the amorphous silicon film is heated in an oxidative atmosphere and thereby oxidized, by which the metallic element is gettered into the oxide. More specifically, this method is carried out as follows (see FIGS. 6A to 6F):

(1) As shown in FIG. 6A, on an insulating substrate (glass substrate) 1, oxide as a base coat film 2 is deposited to a thickness of 2000 Å by sputtering process, and then amorphous silicon 3 is deposited to a thickness of about 1000 Å.

Figure 6B:
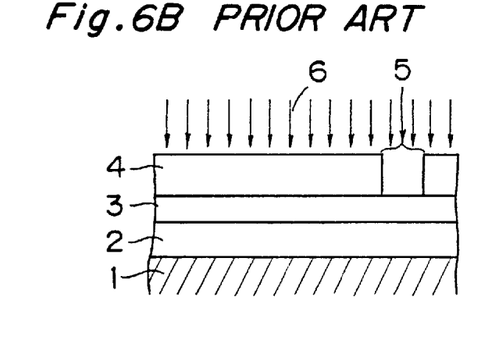

(2) As shown in FIG. 6B, on the amorphous silicon 3, oxide 4 is deposited to a thickness of 1000 Å or more by sputtering process, and patterning is performed, by which a mask is formed.

(3) A metallic element of Ni element 6 or the like is introduced into the amorphous silicon 3 at an opening portion 5.

Figure 6C:
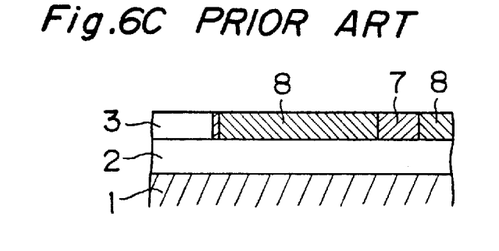

(4) As shown in FIG. 6C, the oxide (mask layer) 4 on the amorphous silicon 3 is removed by etching process, and heated at 550° C., so that surrounding amorphous silicon 3 is crystallized out of a Ni-element high concentration region 7, by which a crystalline silicon film 8 is obtained.

Figure 6D:
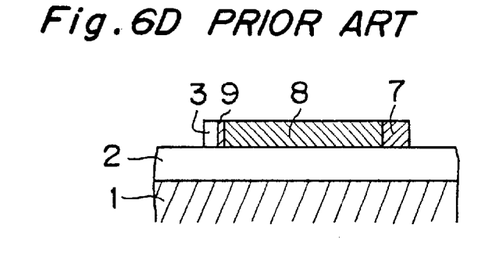
Figure 6E:
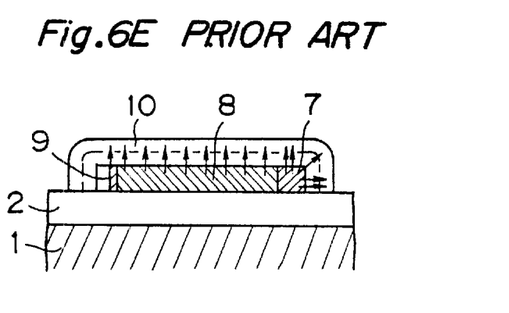

(5) The crystalline silicon film 8 is patterned into an island shape as shown in FIG. 6D, and the surface of the crystalline silicon film 8 is oxidized as shown in FIG. 6E to thereby form oxide 10. In this way, by incorporating the Ni element into the oxide 10, Ni is gettered into the oxide 10. As a result, the concentration of Ni in the crystalline silicon film 8 is reduced. It is noted that reference numeral 9 denotes a crystal growth end.

Figure 6F:
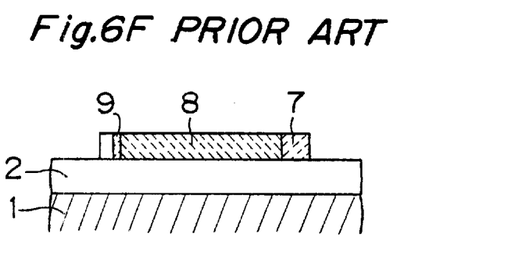

(6) Finally, as shown in FIG. 6F, the surface oxide 10 is completely removed.

(B) Japanese Patent Laid-Open Publications HEI 10-223533

Figure 7A:
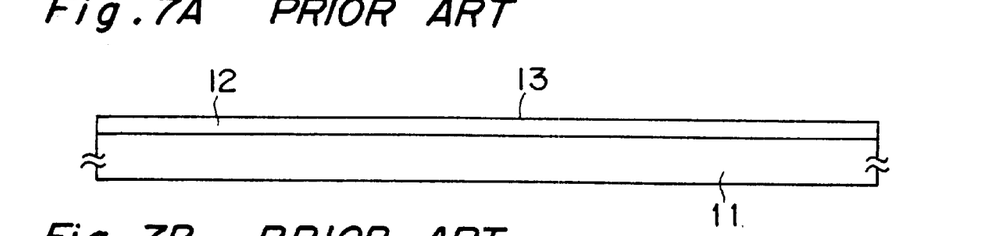
FIGS. 7A to 7F are views showing a prior art method for crystallization of an amorphous silicon film as well as gettering of a metallic element other than that shown in FIGS. 6A to 6F.

After a metallic element serving for acceleration of crystallization is introduced into an amorphous silicon film so that the amorphous silicon film is crystallized, a mask is formed selectively on the amorphous silicon film. Then, one kind or a plurality of kinds of elements among nitrogen, phosphorus, arsenic, antimony and bismuth are added, and the metal in regions where the element or elements are not added is gettered into the region where the element or elements are added. More specifically, this is carried out as follows (see FIGS. 7A to 7F):

(1) As shown in FIG. 7A, on a glass substrate 11 with a 2000 Å silicon oxide (not shown) formed thereon, 500 Å amorphous silicon film 12 is deposited by plasma CVD (chemical vapor deposition) process.

(2) Further, Ni acetate 13 is formed by spin-coating a Ni acetate solution having a Ni concentration of 100 ppm, and a metal of Ni is introduced into the surface of the amorphous silicon film 12.

Figure 7B:
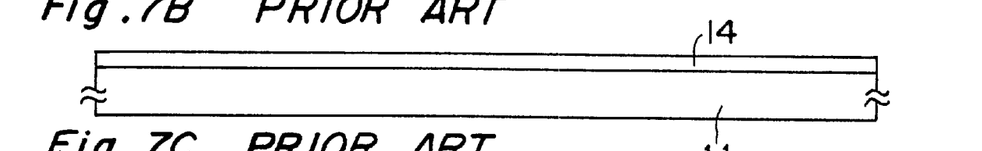

(3) A 4 hour heating process is performed at a temperature of 600° C. so that the amorphous silicon film 12 is crystallized, by which a crystalline silicon film 14 is obtained as shown in FIG. 7B.

(4) With KrF (krypton fluoride) excimer laser beam (wavelength: 248 nm) applied, a laser annealing process is performed.

Figure 7C:
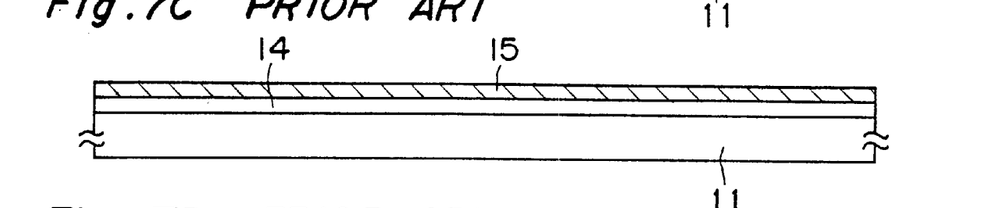

(5) As shown in FIG. 7C, 1000 Å silicon nitride 15 is deposited on the crystalline silicon film 14 by plasma CVD process.

Figure 7D:
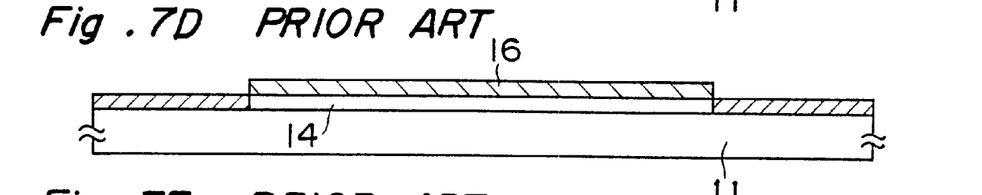

(6) By etching the silicon nitride 15, as shown in FIG. 7D, a mask 16 for implantation of phosphorus is formed.

(7) By plasma doping process, phosphorus is implanted at a dose of $5 \times 10^{14}$ atom/cm$^2$.

Figure 7E:
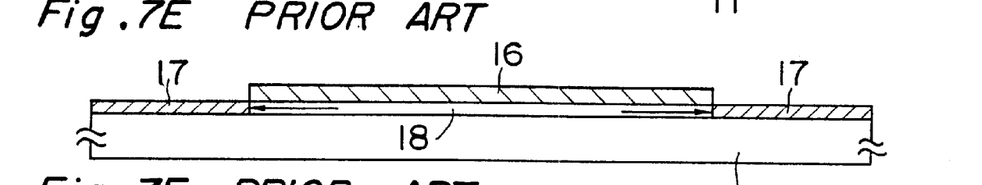

(8) As shown in FIG. 7E, a 2 hour heating process is performed at a temperature of 600° C. in a nitrogen atmosphere, by which Ni of a crystalline silicon film 18 under the mask 16 is moved in the arrow direction and thereby gettered into a region 17 where phosphorus has been implanted. As a result, the concentration of Ni in the crystalline silicon film 18, in which phosphorus has not been implanted, is reduced.

Figure 7F:
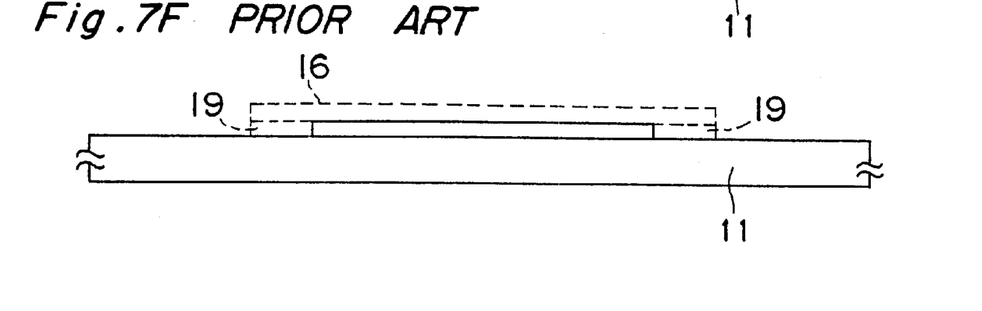

(9) As shown in FIG. 7F, the region 17, in which phosphorus has been implanted by using the mask 16 (to which Ni has moved), is removed, by which the mask 16 is removed. Finally, peripheral part 19 of the gettered region 18 is removed by using a mask (not shown) smaller than the mask 16, and the used mask is also removed.

However, the conventional method including the gettering of a metallic element has the following problems:

(1) Japanese Patent Laid-Open Publication HEI 7-192998

In the growth of a crystalline silicon film using a metallic element serving for acceleration of crystallization, since enough amount of a metallic element is necessitated before crystallization in order to obtain enough crystalline growth, a large amount of the metallic element is contained in the film just before the crystallization. However, after the crystallization, it is desirable that the concentration of the metallic element be as low as possible in terms of the quality of crystalline silicon film and TFT characteristics. That is, the remaining metallic element serves as impurities that adversely affect the TFT characteristics, so that high mobility cannot be obtained and the resulting leak current is large.

Unfortunately, in the crystalline silicon film that has been crystallized by heating process performed after the implementation of a metal serving for acceleration of crystallization into amorphous silicon film, the metal serving for acceleration of crystallization is distributed not uniformly but unevenly. In particular, at grain boundaries at which a plurality of crystal grains contact one another, high-concentration metals are present in a state of compound with silicon. In Japanese Patent Laid-Open Publication HEI 7-192998, the crystalline silicon film is oxidized in order to reduce the remaining metals, in which case oxidation considerably proceeds at grain boundaries where metals are present at high concentrations, and after the oxidation, irregularities of the crystalline silicon film surface are considerably increased. There are some cases where pinholes may be formed particularly at grain boundaries where a plurality of crystal grains contact one another. Avoiding these possibilities makes it impossible to attain enough oxidation for the purpose of gettering, as a problem. Also, irregularities of the crystalline silicon film surface adversely affect the TFT characteristics and cause the carrier scattering to be so large that successful characteristics could not be obtained, as another problem.

Still another problem of Japanese Patent Laid-Open Publication HEI 7-192998 lies in the lowness of gettering capability. Below are shown results of an experiment conducted by the present inventor. This experiment was conducted through the following steps:

(a) Depositing an amorphous silicon film to a film thickness of 650 Å on a quartz substrate by low pressure CVD process;

(b) Applying a Ni acetate solution having a Ni concentration of 10 ppm by spin coating process so that Ni is introduced to the amorphous silicon film surface at a concentration of $1 \times 10^{13}$ atom/cm$^2$;

(c) Conducting a 12 hour heating process at a temperature of 600° C. in a nitrogen atmosphere, thereby crystallizing the amorphous silicon film to obtain a crystalline silicon film;

(d) Forming 500 Å thick oxide on the crystalline silicon film by oxidizing the crystalline silicon film at a temperature of 950° C. in an O$_2$ atmosphere with HCl added thereto, and incorporating Ni into this oxide; and (e) Analyzing Ni in the crystalline silicon film and the oxide by ICP-MS (Inductively Coupled Plasma Mass Spectrometry) process.

As a result of this analysis, the resulting Ni concentration in the crystalline silicon film was $1.0 \times 10^{17}$ atom/cm$^2$, which is too high to obtain successful TFT characteristics, making it found that the gettering was poor. It was also found by surface observation that pinholes were present in the region where a plurality of crystal grains contact one another.

(2) Japanese Patent Laid-Open Publication HEI 10-223533

An issue of Japanese Patent Laid-Open Publication HEI 10-223533 lies in a lowness of its gettering capability. Below are shown results of an experiment conducted by the present inventor. This experiment was conducted through the following steps:

(a) Depositing an amorphous silicon film to a film thickness of 650 Å on a quartz substrate by low pressure CVD process;

(b) Applying a Ni acetate solution having a Ni concentration of 10 ppm by spin coating process so that Ni is introduced to the amorphous silicon film surface at a concentration of $1 \times 10^{13}$ atom/cm$^2$;

(c) Conducting a 12 hour heating process at a temperature of 600° C. in a nitrogen atmosphere, thereby crystallizing the amorphous silicon film to obtain a crystalline silicon film;

(d) Depositing 2000 Å silicon oxide on the crystalline silicon film by atmospheric pressure CVD process;

(e) Forming a mask by etching the silicon oxide;

(f) Implanting phosphorus at a concentration of $4 \times 10^{15}$ atom/cm$^2$ by ion implementation;

(g) Moving and gettering Ni into the region where the phosphorus has been implanted by conducting a 12 hour heating process at a temperature of 600° C. in a nitrogen atmosphere;

(h) With the silicon oxide used as an etching mask, etching and removing the region where Ni has been gettered; and (i) After removing the silicon oxide, analyzing the Ni in the silicon oxide by ICP-MS process.

As a result of this analysis, the resulting Ni concentration in the crystalline silicon film was $1.8 \times 10^{17}$ atom/cm$^2$, which is too high to obtain successful TFT characteristics, making it found that the gettering was poor. This could be attributed to the fact that this metallic element gettering process, in principle, involves diffusing Ni horizontally (laterally) over long distances in the silicon oxide.

SUMMARY OF THE INVENTION

Therefore, an object of the present invention is to provide a method for fabricating a semiconductor device using crystalline silicon film which is small in surface irregularities and so smooth, free from pinholes and high in quality, and which is obtained by performing enough gettering of metal to obtain successful crystallinity and successful TFT characteristics.

In order to achieve the above object, the present invention provides a method for fabricating a semiconductor device comprising: a step for crystallizing an amorphous silicon film to obtain a crystalline silicon film by introducing a metallic element serving for acceleration of crystallization onto the amorphous silicon film, and by performing a first heating process in an non-oxidative atmosphere; a first gettering step for removing or reducing the metallic element present in at least a partial region of the crystalline silicon film by performing a second heating process in a non-oxidative atmosphere; a second gettering step for further removing or reducing the metallic element present in the region of the crystalline silicon film where the first gettering has been effected, by performing a third heating process in an oxidative atmosphere; and a step for removing oxide formed by the second gettering step.

With this constitution, during the vertical growth of the crystalline silicon film, the first gettering process without involving oxidation is performed by performing the second heating process in a non-oxidative atmosphere, and thereafter the second gettering process involving oxidation is performed. Therefore, since the concentration of the metallic element is reduced by the first gettering process to such a level that oxidation does not cause increase of irregularities or occurrence of pinholes, a high-quality crystalline silicon film free from surface irregularities and pinholes can be obtained. Also, in the second gettering process, enough oxidation can be effected without minding any increase of irregularities and occurrence of pinholes, so that the concentration of the metallic element can be reduced to an extremely low level.

Accordingly, a semiconductor device is fabricated with the high-quality crystalline silicon film used as an active layer, so that a high-performance semiconductor device capable of high-speed operation, low-leak current and low-voltage operation can be obtained.

In one embodiment of the present invention, the metallic element serving for acceleration of crystallization is one kind of metallic element or a plurality of metallic elements selected from among iron, cobalt, nickel, copper, ruthenium, rhodium, palladium, osmium, iridium, platinum and gold.

With this constitution, the crystallization of the amorphous silicon film is accelerated by the action of the metallic element, so that the crystalline silicon film can be formed more efficiently, as compared with the case only by thermal annealing.

In one embodiment of the present invention, in the first gettering step, one kind of element or a plurality of kinds of elements selected from among nitrogen, phosphorus, arsenic, antimony and bismuth are introduced onto a surface or into film of a region of the crystalline silicon film except the region from which the metallic element is to be removed or reduced, and thereafter the second gettering process is performed in a non-oxidative atmosphere containing an inert gas such as nitrogen, hydrogen, argon and helium, whereby the metallic element is gettered into the element-introductory region.

With this constitution, since an element which is easily combinable with the metallic element serving for acceleration of crystallization is introduced into the crystalline silicon film, the metallic element can be gettered efficiently even by the first gettering process involving no oxidation in the non-oxidative atmosphere.

In one embodiment of the present invention, in the first gettering step, oxide is deposited on the surface of the crystalline silicon film, the metallic element is gettered into the oxide by performing the second heating process in a non-oxidative atmosphere containing an inert gas such as nitrogen, hydrogen, argon and helium, and thereafter the oxide is removed.

With this constitution, since the metallic element is gettered into the oxide deposited on the surface of the crystalline silicon film, there is no need of patterning for introducing an element which is easily combinable with the metallic element into the crystalline silicon film, as is necessary in an embodiment of the invention. Therefore, the first gettering process is carried out more simply, as compared with the case of the embodiment.

In one embodiment of the present invention, in the first gettering step, oxide is deposited on the surface of the crystalline silicon film, the metallic element is gettered into the oxide by performing the second heating process in a non-oxidative atmosphere containing at least one kind of halogen element selected from among hydrogen chloride, hydrogen fluoride, hydrogen bromide, chlorine, fluorine and bromine, and thereafter the oxide is removed.

With this constitution, the first gettering process is performed in a non-oxidative atmosphere containing a halogen element which is easily combinable with the metallic element serving for acceleration of crystallization. Thus, the gettering effect can be enhanced.

In one embodiment of the present invention, in the second gettering step, by the third heating process in an oxidative atmosphere, thermal oxide is formed on the surface of the crystalline silicon film and the metallic element present in the region of the crystalline silicon film where the first gettering has been effected is incorporated into the thermal oxide, whereby the metallic element is further gettered.

With this constitution, by the third heating process in an oxidative atmosphere, the metallic element is gettered into the thermal oxide formed on the surface of the crystalline silicon film. Therefore, the step of forming oxide for gettering the metallic element is not particularly required, and the semiconductor device fabrication process is simplified.

In one embodiment of the present invention, in the second gettering step, oxide is deposited on the surface of the crystalline silicon film, and by the third heating process in an oxidative atmosphere, the metallic element present in the region of the crystalline silicon film where the first gettering has been effected is incorporated into the oxide, whereby the metallic element is further gettered.

With this constitution, after the oxide for gettering the metallic element is formed on the surface of the crystalline silicon film, the metallic element is gettered by the third heating process in an oxidative atmosphere. Thus, the oxidation of the crystalline silicon film by the third heating process is performed via a previously formed oxide, and a higher-quality crystalline silicon film which is smaller in surface irregularities and freer from pinholes can be obtained as compared with such a case where the oxidation by the third heating process is performed directly on the crystalline silicon film as in an embodiment of the invention.

In one embodiment of the present invention, the oxidative atmosphere in which the third heating process is performed contains at least one kind of halogen element selected from among hydrogen chloride, hydrogen fluoride, hydrogen bromide, chlorine, fluorine and bromine.

With this constitution, the second gettering process is performed in an oxidative atmosphere containing a halogen element which is easily combinable with the metallic element serving for acceleration of crystallization. Thus, the gettering effect can be enhanced.

In one embodiment of the present invention, temperature for the third heating process is 700° C. or higher and 1150° C. or lower.

With this constitution, the third heating process in the second gettering process is performed at a high temperature not lower than 700° C. and not higher than 1150° C. Thus, the diffusion of the metallic element in the oxide is accelerated, so that the gettering effect can be enhanced.

The present invention also provides a method for fabricating a semiconductor device comprising: a step for crystallizing an amorphous silicon film to obtain a crystalline silicon film by introducing a metallic element serving for acceleration of crystallization onto a partial region of the amorphous silicon film, and by performing a first heating process in an non-oxidative atmosphere; a first gettering step for removing or reducing the metallic element present in a region of the crystalline silicon film except regions of the crystalline silicon film vertically crystallized from the partial region, by performing a second heating process in a non-oxidative atmosphere; a second gettering step for further removing or reducing the metallic element present in the region of the crystalline silicon film where the first gettering has been effected, by performing a third heating process in an oxidative atmosphere; and a step for removing oxide formed by the second gettering step.

With this constitution, during the horizontal growth of the crystalline silicon film, the first gettering process without involving oxidation is performed by performing the second heating process in a non-oxidative atmosphere, and thereafter the second gettering process involving oxidation is performed. Therefore, since the concentration of the metallic element is reduced by the first gettering process to such a level that oxidation does not cause increase of irregularities or occurrence of pinholes, a high-quality crystalline silicon film free from surface irregularities and pinholes can be obtained. Also, in the second gettering process, enough oxidation can be effected without minding any increase of irregularities and occurrence of pinholes, so that the concentration of the metallic element can be reduced to an extremely low level.

Accordingly, a semiconductor device is fabricated with the high-quality crystalline silicon film used as an active layer, so that a high-performance semiconductor device capable of high-speed operation, low-leak current and low-voltage operation can be obtained.

In one embodiment of the present invention, the metallic element serving for acceleration of crystallization is one kind of metallic element or a plurality of metallic elements selected from among iron, cobalt, nickel, copper, ruthenium, rhodium, palladium, osmium, iridium, platinum and gold.

With this constitution, the crystallization of the amorphous silicon film is accelerated by the action of the metallic element, so that the crystalline silicon film can be formed more efficiently, as compared with the case only by thermal annealing.

In one embodiment of the present invention, in the first gettering step, one kind of element or a plurality of kinds of elements selected from among nitrogen, phosphorus, arsenic, antimony and bismuth are introduced onto a surface or into film of a region of the crystalline silicon film including the region into which the metallic element has been introduced, and thereafter the second heating process is performed in a non-oxidative atmosphere containing an inert gas such as nitrogen, hydrogen, argon and helium, whereby the metallic element is gettered into the element-introductory region.

With this constitution, since an element which is easily combinable with the metallic element serving for acceleration of crystallization is introduced into the crystalline silicon film, the metallic element can be gettered efficiently even by the first gettering process involving no oxidation in the non-oxidative atmosphere.

In one embodiment of the present invention, in the first gettering step, oxide is deposited on the surface of the crystalline silicon film, the metallic element is gettered into the oxide by performing the second heating process in a non-oxidative atmosphere containing an inert gas such as nitrogen, hydrogen, argon and helium, and thereafter the oxide is removed.

With this constitution, since the metallic element is gettered into the oxide deposited on the surface of the crystalline silicon film, there is no need of patterning for introducing an element which is easily combinable with the metallic element into the crystalline silicon film, as is necessary in an embodiment of the invention. Therefore, the first gettering process is carried out more simply, as compared with the case of the embodiment.

In one embodiment of the present invention, in the first gettering step, oxide is deposited on the surface of the crystalline silicon film, the metallic element is gettered into the oxide by performing the second heating process in a non-oxidative atmosphere containing at least one kind of halogen element selected from among hydrogen chloride, hydrogen fluoride, hydrogen bromide, chlorine, fluorine and bromine, and thereafter the oxide is removed.

With this constitution, the first gettering process is performed in a non-oxidative atmosphere containing a halogen element which is easily combinable with the metallic element serving for acceleration of crystallization. Thus, the gettering effect can be enhanced.

In one embodiment of the present invention, in the second gettering step, by the third heating process in an oxidative atmosphere, thermal oxide is formed on the surface of the crystalline silicon film and the metallic element present in the region of the crystalline silicon film where the first gettering has been effected is incorporated into the thermal oxide, whereby the metallic element is further gettered.

With this constitution, by the third heating process in an oxidative atmosphere, the metallic element is gettered into the thermal oxide formed on the surface of the crystalline silicon film. Therefore, the step of forming oxide for gettering the metallic element is not particularly required, and the semiconductor device fabrication process is simplified.

In one embodiment of the present invention, in the second gettering step, oxide is deposited on the surface of the crystalline silicon film, and by the third heating process in an oxidative atmosphere, the metallic element present in the region of the crystalline silicon film where the first gettering has been effected is incorporated into the oxide, whereby the metallic element is further gettered.

With this constitution, after the oxide for gettering the metallic element is formed on the surface of the crystalline silicon film, the metallic element is gettered by the third heating process in an oxidative atmosphere. Thus, the oxidation of the crystalline silicon film by the third heating process is performed via a previously formed oxide, and a higher-quality crystalline silicon film which is smaller in surface irregularities and freer from pinholes can be obtained as compared with such a case where the oxidation by the third heating process is performed directly on the crystalline silicon film as in an embodiment of the invention.

In one embodiment of the present invention, the oxidative atmosphere in which the third heating process is performed contains at least one kind of halogen element selected from among hydrogen chloride, hydrogen fluoride, hydrogen bromide, chlorine, fluorine and bromine.

With this constitution, the second gettering process is performed in an oxidative atmosphere containing a halogen element which is easily combinable with the metallic element serving for acceleration of crystallization. Thus, the gettering effect can be enhanced.

In one embodiment of the present invention, temperature for the third heating process is 700° C. or higher and 1150° C. or lower.

With this constitution, the third heating process in the second gettering process is performed at a high temperature not lower than 700° C. and not higher than 1150° C. Thus, the diffusion of the metallic element in the oxide is accelerated, so that the gettering effect can be enhanced.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, the present invention is described in detail by way of embodiments thereof illustrated in the accompanying drawings.

A metal serving for acceleration of crystallization remains in a state of compounds with silicon at grain boundaries in a crystalline silicon film. In the case that the metal serving for acceleration of crystallization is reduced by oxidation, oxidation considerably proceeds at grain boundaries where metals are present at high concentrations. Therefore, after the oxidation, irregularities of the crystalline silicon film surface are considerably increased, causing pinholes to be formed.

Therefore, in this embodiment, with respect to the metal for crystallization acceleration, a gettering process involving no oxidation (first gettering process) is first performed in non-oxidative atmosphere.

The metal concentration is reduced by the first gettering process to such a level that oxidation does not cause increase of irregularities or occurrence of pinholes. Then, a gettering process by oxidation (second gettering process) is performed, thus allowing enough metal gettering to be implemented.

As to the direction of growth of the crystalline silicon film, there are vertical growth and horizontal growth. In the vertical growth, a metallic element serving for acceleration of crystallization is introduced over the entire surface of the amorphous silicon film and crystallized by heating process. In the horizontal growth, a metallic element serving for acceleration of crystallization is introduced to part of the amorphous silicon film and crystallized horizontally at the introductory site by heating process. These vertical growth and horizontal growth are outlined below.

<First Embodiment>

The vertical growth is carried out as follows.

(I-1.1) First Method for First Gettering Process in First Embodiment

A metallic element serving for acceleration of crystallization is introduced over the entire surface of an amorphous silicon film, and the amorphous silicon film is crystallized by a first heating process. Thereafter, oxide is deposited on the crystallized silicon film by CVD process and patterned, and phosphorus as an element which is easily combinable with the metallic element is implanted by ion implantation to the surface of the crystalline silicon film through the opening of the oxide pattern. Next, a second heating process is performed in a non-oxidative atmosphere containing inert gas such as nitrogen, hydrogen, Ar, He, etc., by which the metallic element is gettered into the region of the crystalline silicon film where phosphorus has been implanted. One kind of element or a plurality of kinds of elements among nitrogen, arsenic, antimony and bismuth may also be implanted instead of phosphorus. Desirably, before a second gettering process which will be performed later, a region containing the region of the crystalline silicon film to which phosphorus has been implanted (i.e., a region where the metallic element has been gettered) is removed in advance, by which the metallic element is prevented from diffusing into the other regions and outward of the substrate from the region in later processes.

(I-1.2) Second Method for First Gettering Process in First Embodiment

A metallic element serving for acceleration of crystallization is introduced over the entire surface of a amorphous silicon film, and the amorphous silicon film is crystallized by a first heating process. Thereafter, oxide is deposited on the crystallized silicon film by CVD process, and a second heating process is performed in a non-oxidative atmosphere containing inert gas such as nitrogen, hydrogen, Ar, He, etc., by which the metallic element is gettered into the oxide. In addition, a higher gettering effect can be obtained when the second heating process is performed in a non-oxidative atmosphere containing at least one kind of halogen element selected from among HCl, HF, HBr, $Cl_2$, $F_2$, $Br_2$ and the like, which are easily combinable with the metallic element. Like this, whereas a patterning for implementation of phosphorus is involved in the first method, the patterning is unnecessary in this second method. Therefore, the second method can be fulfilled with simpler processes, and is capable of obtaining high yield with low cost, as compared with the first method.

(I-2.1) First Method for Second Gettering Process in First Embodiment

After removing the oxide formed on the surface of the crystalline silicon film by the first gettering process, a third heating process is performed in an oxidative atmosphere, and the metallic element in the crystalline silicon film is gettered by incorporating the metallic element into the formed oxide. The oxidative atmosphere refers to an atmosphere containing oxygen, water vapor or the like. In addition, a higher gettering effect can be obtained when the third heating process is performed in an oxidative atmosphere containing at least one kind of halogen element selected from among HCl, HF, HBr, $Cl_2$, $F_2$, $Br_2$ and the like. Also, it is desirable that the temperature of the third heating process be within a range of 700° C.–1150° C. That is, the higher the heating process temperature is, the more the diffusion of the metallic element in the oxide is accelerated, so that a high gettering effect can be obtained.

(I-2.2) Second Method for Second Gettering Process in First Embodiment

After removing the oxide formed on the surface of the crystalline silicon film by the first gettering process, oxide is deposited once again on the surface of the crystalline silicon film. Thereafter, a third heating process is performed in an oxidative atmosphere, and the metallic element in the crystalline silicon film is gettered by incorporating the metallic element into the oxide. The oxidative atmosphere refers to an atmosphere containing oxygen, water vapor and the like.

In addition, a higher gettering effect can be obtained when the third heating process is performed in the oxidative atmosphere containing at least one kind of halogen element selected from among HCl, HF, Br, $Cl_2$, $F_2$, $Br_2$ and the like. Also, it is desirable that the temperature of the third heating process be within a range of 700° C.–1150° C. That is, the higher the heating process temperature is, the more the diffusion of the metallic element in the oxide is accelerated, so that a high gettering effect can be obtained. Like this, since the oxidation of the crystalline silicon film is performed via the previously formed oxide in the second method, a crystalline silicon film which is smaller in surface irregularities and freer from pinholes can be obtained as compared with the first method in which the oxidation is started directly on the crystalline silicon film.

As described above, in the first embodiment, in the method for fabricating a semiconductor device including steps of introducing a metallic element serving for acceleration of crystallization over the entire surface of an amorphous silicon film and performing crystallization in the vertical direction by the first heating process, a second heating process is performed in a non-oxidative atmosphere containing contain inert gas, by which a first gettering of the metallic element into the crystalline silicon film is achieved. Thereafter, a second gettering is performed by performing a third heating process in an oxidative atmosphere so that the metallic element in the crystalline silicon film is incorporated into the oxide.

Therefore, by the first gettering, the concentration of the metallic element is reduced to such a level that oxidation does not cause increase of surface irregularities and occurrence of pinholes. As a result, in the subsequent second gettering process, enough oxidation can be effected without minding any increase of irregularities and occurrence of pinholes, so that the concentration of the metallic element can be reduced to an extremely low level.

That is, according to this embodiment, gettering process is carried out in two steps of the first gettering process in a non-oxidative atmosphere and the second gettering process in an oxidative atmosphere. As a result, an extremely high-quality crystalline silicon film which is free from surface irregularities and pinholes and into which the metallic element has been gettered to a level lower than its conventional counterpart can be formed. Therefore, by fabricating a semiconductor device using the high-quality crystalline silicon film as an active layer, a high-performance semiconductor device capable of high-speed operation, low-leak current and low-voltage operation can be obtained.

<Second Embodiment>

The aforementioned horizontal growth is carried out as follows.

(II-1.1) First Method for First Gettering Process in Second Embodiment

A metallic element serving for acceleration of crystallization is introduced to amorphous silicon film at an opening portion with an oxide pattern used as a mask, and crystallized by a first heating process. Thereafter, further patterning is performed, and phosphorus is implanted into the surface of the crystalline silicon film, in which the oxide is opened, by ion implantation. Next, a second heating process is performed in a non-oxidative atmosphere containing inert gas such as nitrogen, hydrogen, Ar, He, etc., by which the metallic element is gettered into the region of the crystalline silicon film where phosphorus has been implanted. One kind of element or a plurality of kinds of elements among nitrogen, arsenic, antimony and bismuth may also be implanted instead of phosphorus. Desirably, before a second gettering process which will be performed later, a region containing the region of the crystalline silicon film to which phosphorus has been implanted (i.e., a region where the metallic element has been gettered) is removed in advance, by which the metallic element is prevented from diffusing into the other regions and outward of the substrate from the region in later processes.

(II-1.2) Second Method for First Gettering Process in Second Embodiment

A metallic element serving for acceleration of crystallization is introduced to a partial region of the amorphous silicon film, and the amorphous silicon film is crystallized by a first heating process. Thereafter, oxide is deposited by CVD process, and a second heating process is performed in a non-oxidative atmosphere containing inert gas such as nitrogen, hydrogen, Ar, He, etc., by which the metallic element is gettered into the oxide. In addition, a higher gettering effect can be obtained when the second heating process is performed in a non-oxidative atmosphere containing at least one kind of halogen element selected from among HCl, HF, HBr, $Cl_2$, $F_2$, $Br_2$ and the like.

(II-2.1) First Method for Second Gettering Process in Second Embodiment

After removing the oxide formed on the surface of the crystalline silicon film by the first gettering process, a third heating process is performed in an oxidative atmosphere, and the metallic element in the crystalline silicon film is gettered by incorporating the metallic element into the formed oxide. The oxidative atmosphere refers to an atmosphere containing oxygen, water vapor and the like. In addition, a higher gettering effect can be obtained when the third heating process is performed in an oxidative atmosphere containing at least one kind of halogen element selected from among HCl, HF, HBr, $Cl_2$, $F_2$, $Br_2$ and the like. Also, it is desirable that the temperature of the third heating process be within a range of 700° C.–1150° C. That is, the higher the heating process temperature is, the more the diffusion of the metallic element in the oxide is accelerated, so that a high gettering effect can be obtained.

(II-2.2) Second Method for Second Gettering Process in Second Embodiment

After removing the oxide formed on the surface of the crystalline silicon film by the first gettering process, oxide is deposited once again on the surface of the crystalline silicon film. Thereafter, a third heating process is performed in an oxidative atmosphere, and the metallic element in the crystalline silicon film is gettered by incorporating the metallic element into the oxide. The oxidative atmosphere refers to an atmosphere containing oxygen, water vapor and the like. In addition, a higher gettering effect can be obtained when the third heating process is performed in an oxidative atmosphere containing at least one kind of halogen element selected from among HCl, HF, HBr, $Cl_2$, $F_2$, $Br_2$ and the like. Also, it is desirable that the temperature of the third heating process be within a range of 700° C.–1150° C. That is, the higher the heating process temperature is, the more the diffusion of the metallic element in the oxide is accelerated, so that a high gettering effect can be obtained. Like this, since the oxidation of the crystalline silicon film is performed via the previously formed oxide in the second method, a crystalline silicon film which is smaller in surface irregularities and freer from pinholes can be obtained as compared with the first method in which the oxidation is started directly on the crystalline silicon film.

As described above, in the second embodiment, in the method for fabricating a semiconductor device including steps of introducing a metallic element serving for acceleration of crystallization to the amorphous silicon film at its opening portion with an oxide pattern used as a mask, and performing crystallization in the horizontal direction by the first heating process, gettering process is carried out in two steps of the first gettering process in a non-oxidative atmosphere and the second gettering process in an oxidative atmosphere.

As a result, an extremely high-quality crystalline silicon film which is free from surface irregularities and pinholes and into which the metallic element has been gettered to a level lower than its conventional counterpart can be formed. Therefore, according to this embodiment, by fabricating a semiconductor device using the high-quality crystalline silicon film as an active layer, a high-performance semiconductor device capable of high-speed operation, low-leak current and low-voltage operation can be obtained.

Now by way of some examples, the above embodiments are explained concretely.

<First Example>

This example is described on a case where the vertical growth described in the first embodiment is performed by the first method in the first gettering process and performed by the first method in the second gettering process, with reference to FIGS. 1A to 1M.

Figures 1A, 1B, 1C, 1D, 1E, 1F, 1H, 1I, 1J, 1K, 1L, 1M:
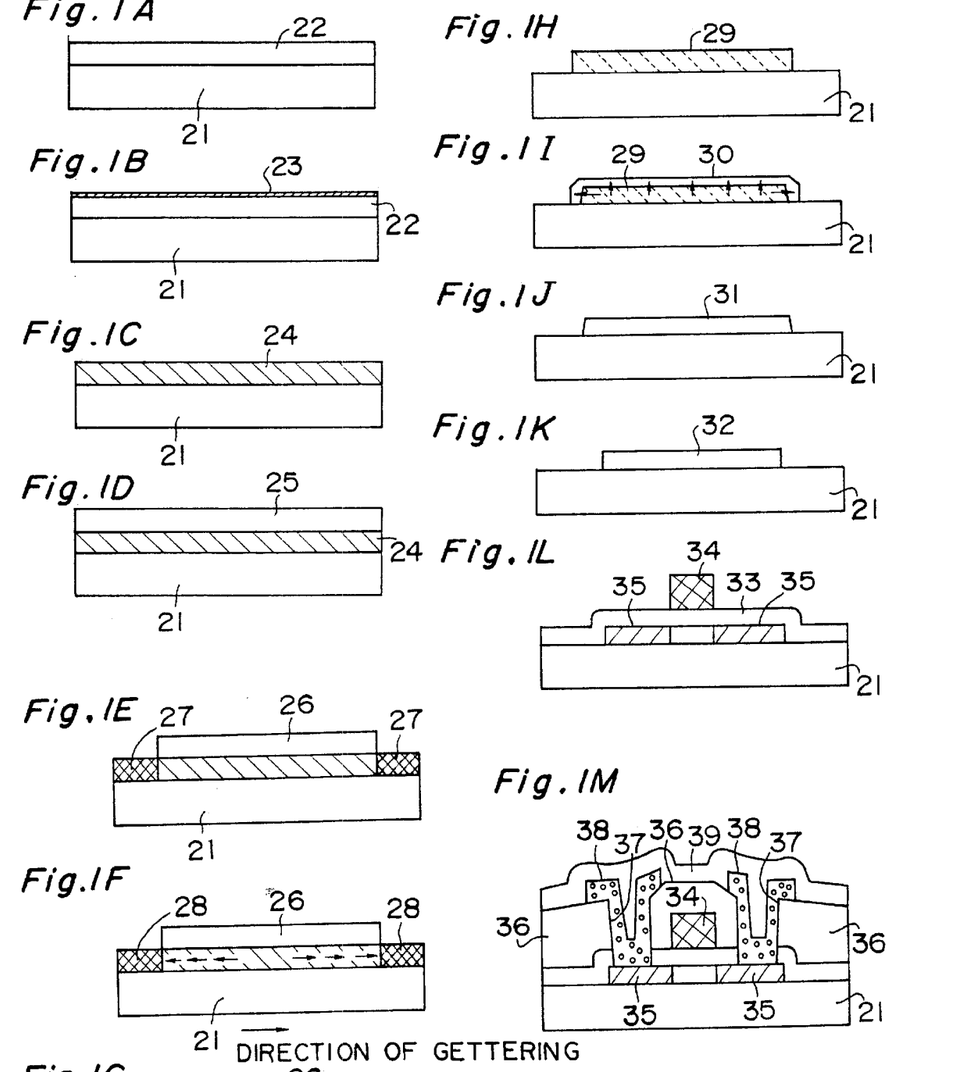
FIGS. 1A to 1M are views showing an example of a first embodiment of a method for fabricating a semiconductor device according to the present invention.

(1) As shown in FIG. 1A, an amorphous silicon film 22 is deposited at a film thickness of 650 Å on a quartz substrate 21 by low pressure CVD process. In this case, the material gas is disilane gas ($Si_2H_6$), the temperature is 450° C. and the pressure is 25 Pa.

(2) As shown in FIG. 1B, by spin coating of an alcohol solution in which nickel acetate 23 has been dissolved to a concentration of 10 ppm, a metal of Ni serving for acceleration of crystallization is introduced to the surface of the amorphous silicon film 22. In this case, the Ni concentration at the surface of the amorphous silicon film 22 is $1\times10^{13}$ atom/$cm^2$. It is noted that as the method for introduction of the metal (Ni), sputtering process, CVD process, plasma processing and adsorption process may also be applied.

(3) A 12 hour first heating process is performed at a temperature of 600° C. in a nitrogen atmosphere, thereby crystallizing the amorphous silicon film 22 as shown in FIG. 1C. As a result of analyzing the Ni concentration in a crystalline silicon film 24 by ICP-MS process, the Ni concentration was $1.5\times10^{18}$ atom/$cm^2$.

(4) As shown in FIG. 1D, oxide 25 is deposited at a film thickness of 500 Å on the crystalline silicon film 24 by CVD process. Then, a resist pattern (not shown) is formed on the oxide 25 by photolithography, and with this resist pattern used as a mask, oxide etching is performed by using buffered hydrofluoric acid as shown in FIG. 1E.

(5) Further, with an oxide pattern 26 used as a mask, phosphorus is ion implanted at a concentration of about $4\times10^{15}$ atom/$cm^2$ through the opening of the oxide pattern 26 to the region of the crystalline silicon film 27 containing a high concentration of Ni with an accelerating energy of 15 keV.

(6) After removing the resist, a 12 hour second heating process is performed at a temperature of 600° C. in a nitrogen atmosphere, by which Ni is gettered into a phosphorus-implanted region 28 in the crystalline silicon film 24 as shown by arrow in FIG. 1F. The Ni concentration in the crystalline silicon film 24 after this first gettering process was analyzed by ICP-MS process. As a result, the Ni concentration was $1.8\times10^{17}$ atom/$cm^2$, so that one-order reduction from the concentration immediately can be obtained after the crystallization.

Figure 1G:
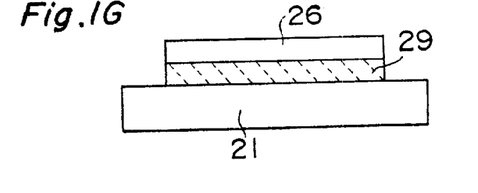

(7) By using the oxide pattern 26 on the surface of the crystalline silicon film 24 as a mask, the first gettering process region, i.e., the crystalline silicon film region 28 containing high-concentration Ni is removed by dry etching process as shown in FIG. 1G. In this way, in later processes, Ni is prevented from diffusing into the gettered region, and Ni that has once been diffused into the outside air is prevented from depositing and diffusing into the gettered region again. If Ni is permitted to re-diffuse into the gettered region, etching of the Ni-implanted region 28 may be executed after the second gettering process.

(8) As shown in FIG. 1H, the oxide pattern 26 on the surface of a crystalline silicon film 29 is removed with buffered hydrofluoric acid, and a third heating process is performed in an $O_2$ atmosphere at a temperature of 950° C. Then, as shown in FIG. 1I, Ni in the crystalline silicon film 29 is gettered into oxide 30 formed at a film thickness of 300 Å. In this second gettering, a higher gettering effect can be obtained when the heating process is performed in an oxidative atmosphere containing at least one kind of halogen element selected from among HCl, HF, HBr, $Cl_2$, $F_2$, $Br_2$ and the like. For example, in the case where the oxidation is performed in an atmosphere in which HCl has been added to $O_2$, according to an analysis of Ni concentration in the crystalline silicon film 29 by ICP-MS process, the Ni concentration is $5.9\times10^{15}$ atom/$cm^2$, so that a further two-order reduction can be conducted from that of the time point of (6) (at a time point of the first gettering process). Also, the reduction of Ni concentration is a reduction of two orders from the Ni concentration of $1.0\times10^{17}$ atom/$cm^2$ in the case of Japanese Patent Laid-Open Publication HEI 7-192998, or the Ni concentration of $1.8\times10^{17}$ atom/$cm^2$ in the case of Japanese Patent Laid-Open Publication HEI 10-223533. Also, temperature of the heating process is preferably within a range of 700° C.–1150° C. The higher the heating process temperature is, the more the diffusion of the metallic element in the oxide 30 is accelerated, so that a high gettering effect can be obtained.

(9) The oxide 30 on the surface of the crystalline silicon film 29 is removed by using buffered hydrofluoric acid. In this way, a high-quality crystalline silicon film 31, into which Ni has been gettered, is formed as shown in FIG. 1J.

From this on, a method for fabricating an N-channel TFT using the resulting high-quality crystalline silicon film 31 is described. This fabrication method for N-channel TFTs is also applicable commonly to high-quality crystalline silicon films obtained by later-described other examples.

(10) In order that a portion 32 of the crystalline silicon film 31 that makes an active region of the TFT is left in an island shape, patterning is performed by photolithography and dry etching as shown in FIG. 1K.

(11) As shown in FIG. 1L, oxide is formed at a film thickness of 800 Å by CVD process as a gate insulator 33;

(12) After crystalline silicon is deposited at a film thickness of 3000 Å on the gate insulator 33 by CVD process, phosphorus is thermally diffused into the crystalline silicon by using PoCl. Further, a gate electrode 34 is formed by using photolithography and dry etching.

(13) With the gate electrode 34 used as a mask, ion implantation is performed at a concentration of $2 \times 10^{15}$ atom/cm$^2$, by which a source/drain region 35 is formed.

(14) As shown in FIG. 1M, oxide is formed at a film thickness of 6000 Å by CVD process as an interlayer insulator 36, and a 30 minute heating process is performed at a temperature of 950° C. in a nitrogen atmosphere in order to activate the dopant ion-implanted at the step of (13).

(15) Contact holes 37 are formed in the interlayer insulator 36 by using photolithography and dry etching.

(16) After AlSi is deposited at a film thickness of 4000 Å by sputtering process, interconnections (metal electrodes) 38 are formed in the contact holes 37 by using photolithography and dry etching.

(17) Nitride as an overcoat 39 is formed at a film thickness of 4000 Å by CVD process. Then, a heating process for sintering is performed for 30 minutes at a temperature of 420° C. in a hydrogen atmosphere.

(18) Finally, contact holes (not shown) to the interconnections 38 are formed by using photolithography and dry etching. Thus, a high-performance N-channel TFT is formed.

(Second Example)

In this example, as an example different from the foregoing first example with respect to the vertical growth, a case where the second gettering process is performed by the second method is described with reference to FIG. 2. In this example, first, in the same way as the steps (1)–(7) in the first example, a crystalline silicon film 42 into which Ni has been gettered by the first method is formed on a quartz substrate 41.

Figure 2A:
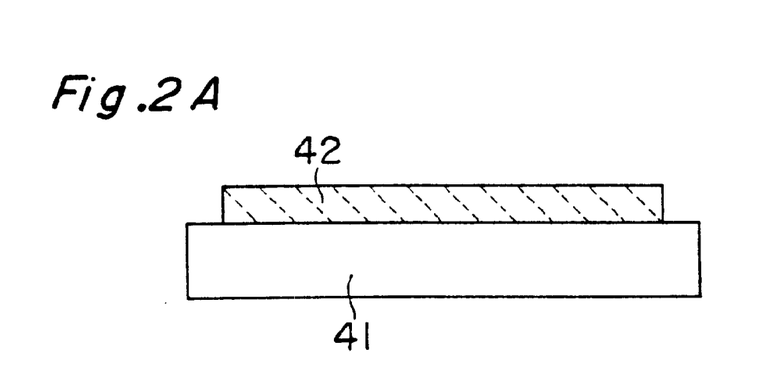
FIGS. 2A to 2D are views showing an example of the first embodiment other than that shown in FIGS. 1A to 1M.
Figure 2B:
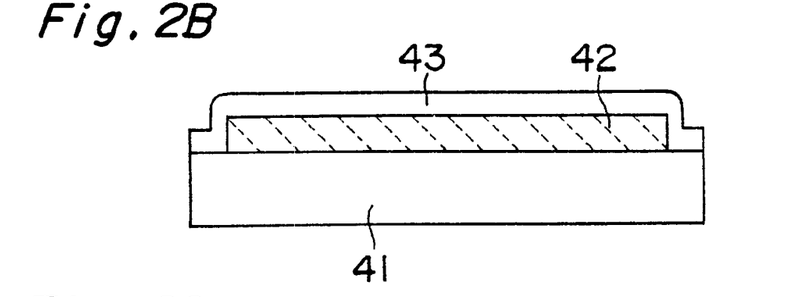
Figure 2C:
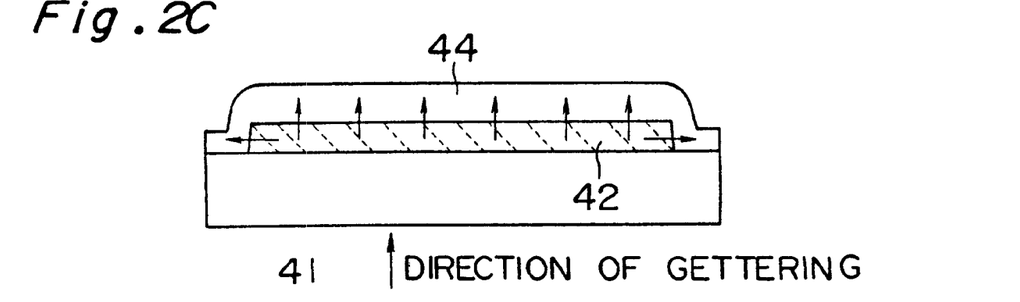

(8) An oxide pattern on the surface of the crystalline silicon film 42 is removed by using buffered hydrofluoric acid, thus resulting in a state shown in FIG. 2A. Then, as shown in FIG. 2B, oxide 43 is deposited at a film thickness of 300 Å by low pressure CVD process. Then, further, oxidation is performed at a temperature of 950° C. in an O$_2$ atmosphere so that the film thickness of oxide 44 finally becomes 600 Å as shown in FIG. 2C. The second gettering is achieved by the heating process in that process, by which Ni in the crystalline silicon film 42 is incorporated into the oxide 44 as shown by arrows in FIG. 2C.

In this second gettering, a higher gettering effect can be obtained when the heating process is performed in an oxidative atmosphere containing at least one kind of halogen element selected from among HCl, HF, HBr, Cl$_2$, F$_2$, Br$_2$ and the like. Also, the heating process temperature is desirably within a range of 700° C.–1150° C., and the higher the heating process temperature is, the more the diffusion of the metallic element in the oxide 44 is accelerated, so that a high gettering effect can be obtained.

Figure 2D:
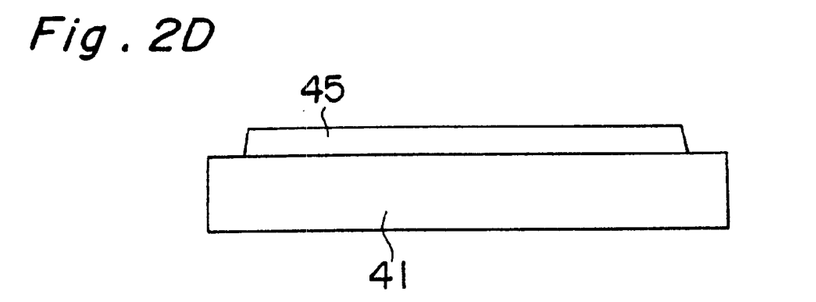

(9) The oxide 44 on the surface of the crystalline silicon film 42 is removed by using buffered hydrofluoric acid. In this way, a high-quality crystalline silicon film 45, into which Ni has been gettered, can be obtained as shown in FIG. 2D.

As described above, in the second gettering according to this example, since the oxidation of the crystalline silicon film 42 is performed via the previously formed oxide 43, a crystalline silicon film 45 which is smaller in surface irregularities, smoother and freer from pinholes can be obtained as compared with such a case where the oxidation is performed directly on the crystalline silicon film that has undergone the first engage as in the first example.

After this on, when an N-channel TFT is fabricated by using the resulting high-quality crystalline silicon film 45, the same procedure as the steps (10)–(18) in the first example may be executed.

(Third Example)

In this example, as an example different from the first and second examples with respect to the vertical growth, a case where the first gettering process is performed by the second method and the second gettering process is performed by the first method is described with reference to FIG. 3. In this example, first, in the same way as the steps (1)–(3) in the first example, a crystalline silicon film 52 in which an amorphous silicon film has been crystallized on a quartz substrate 51, resulting in a state of FIG. 3A.

Figure 3A:
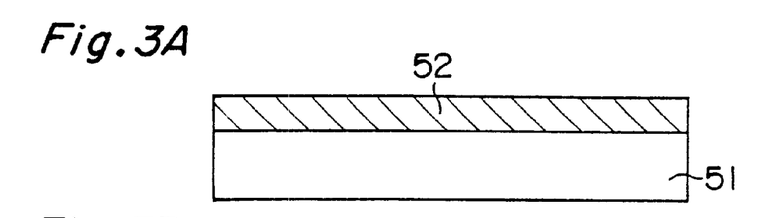
FIGS. 3A to 3F are views showing an example of the first embodiment other than those shown in FIGS. 1A to 1M and 2A to 2D.
Figure 3B:
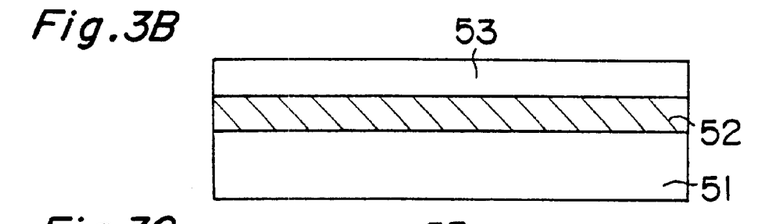

(4) As shown in FIG. 3B, oxide 53 is deposited at a film thickness of 2200 Å by CVD process.

Figure 3C:
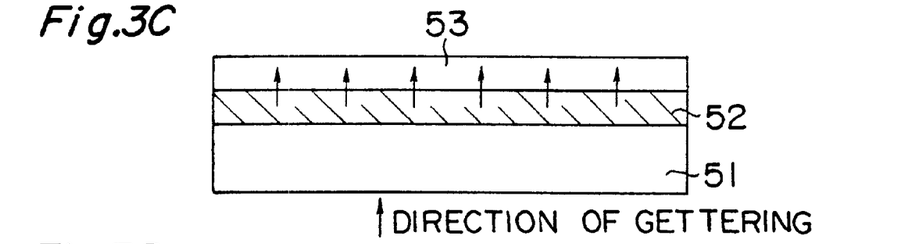

(5) A 1 hour heating process is performed at a temperature of 950° C. in a nitrogen atmosphere, by which Ni is gettered into the oxide 53 as shown in FIG. 3C (first gettering process).

Figure 3D:
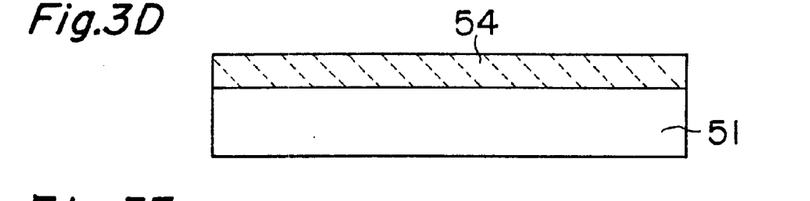
Figures 3E, 3F:
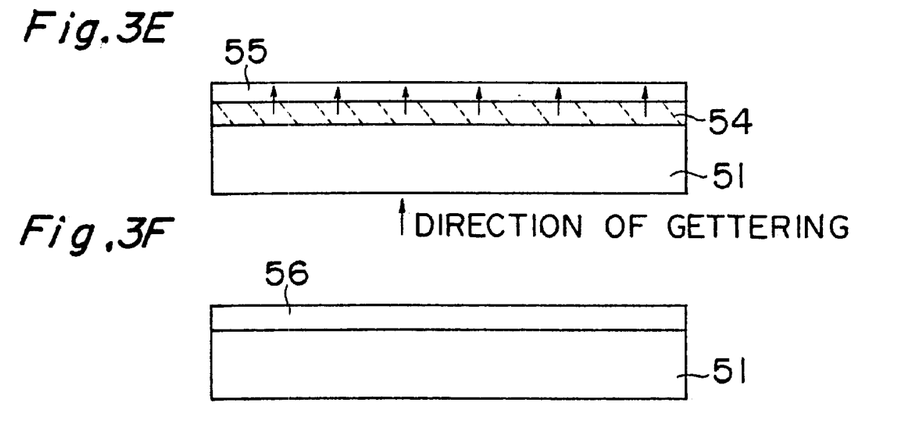

(6) As shown in FIG. 3D, the oxide 53 on the surface of the crystalline silicon film 52 is removed by using buffered hydrofluoric acid. Then, as shown in FIG. 3E, oxidation is performed at a temperature of 950° C. in an O$_2$ atmosphere so that 300 Å thick oxide 55 can be obtained. The second gettering is achieved by the heating process in this step, and Ni in a crystalline silicon film 54 is incorporated into the oxide 55 as shown by arrows in FIG. 3E. When this second gettering is performed in an atmosphere in which HCl has been added to O$_2$, a higher Ni reduction effect can be obtained. Further, a crystalline silicon film which is smaller in surface irregularities, smoother and freer from pinholes can be obtained when CVD oxide is deposited before the oxidation.

(7) Finally, as shown in FIG. 3F, the oxide 55 on the surface of a high-quality crystalline silicon film 56 is removed by using buffered hydrofluoric acid.

According to this example, since phosphorus is not implanted in the first gettering process, the first gettering process can be simplified as compared with the first and second examples. Therefore, according to this example, lower cost, higher productivity and higher yield can be realized. In addition, when an N-channel TFT is fabricated by using the resulting high-quality crystalline silicon film 56, the same procedure as the steps (10)–(18) in the first example may be executed.

(Fourth Example)

In this example, a case where for the horizontal growth described in the second embodiment, the first gettering process is performed by the first method and the second gettering process is performed by the first method is concretely described with reference to FIG. 4.

Figure 4A:
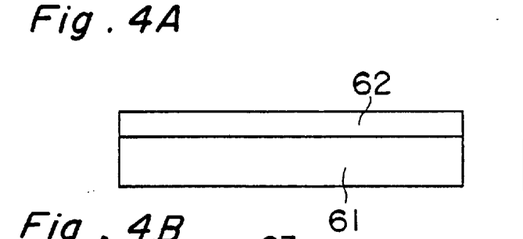
FIGS. 4A to 4J are views showing an example of a second embodiment of the method for fabricating the semiconductor device according to the present invention.

(1) As shown in FIG. 4A, an amorphous silicon film 62 is deposited at a film thickness of 650 Å on a quartz substrate 61 by low pressure CVD process. In this case, the material gas is disilane gas (Si$_2$H$_6$), the temperature is 450° C. and the pressure is 25 Pa (pascal).

Figure 4B:
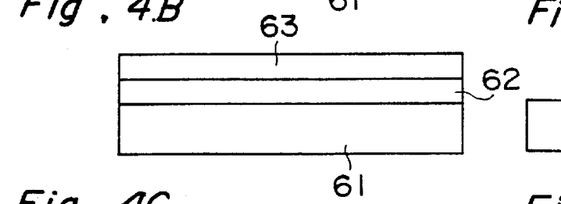

(2) As shown in FIG. 4B, oxide 63 is deposited at a film thickness of 2200 Å by CVD process. Then, a resist pattern (not shown) is formed on the oxide 63 by photolithography, and with this resist pattern used as a mask, oxide etching is performed by using buffered hydrofluoric acid as shown in FIG. 4C.

Figures 4C, 4D, 4E, 4I, 4J:
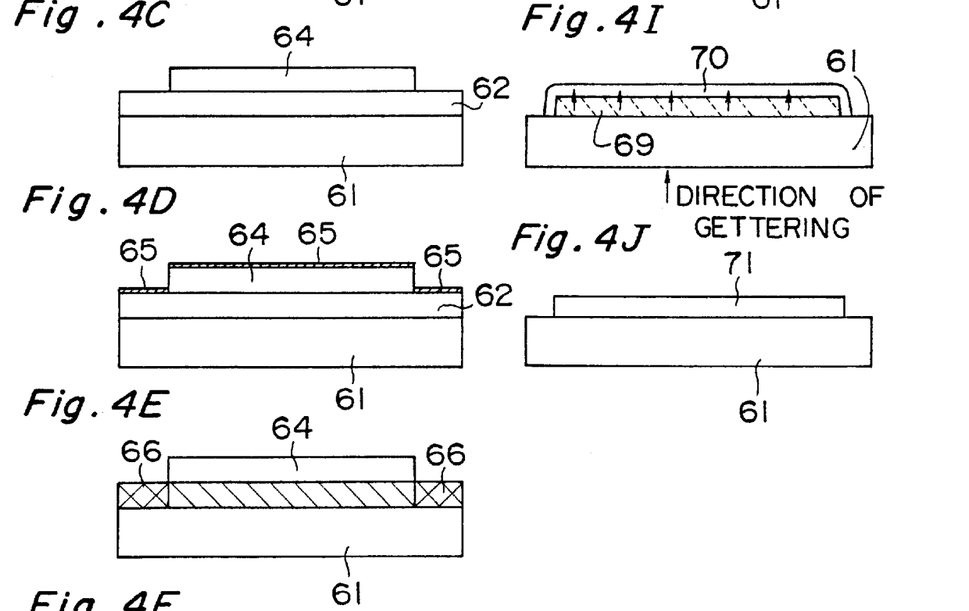

(3) After removing the resist pattern, an alcohol solution in which nickel acetate 65 has been dissolved to a concentration of 10 ppm is applied by spin coating onto patterned oxide 64 and the amorphous silicon film 62 as shown in FIG. 4D, by which a metal of Ni serving for acceleration of crystallization is introduced to the surface of the amorphous silicon film 22 through the opening of the oxide 64.

(4) A 12 hour heating process is performed at a temperature of 580° C. in a nitrogen atmosphere, by which crystallization is effected horizontally (i.e., in a direction of the amorphous silicon film 62 under the oxide pattern 64) from the region of a crystalline silicon film 66 where Ni is contained at higher concentration.

(5) With the oxide pattern 64 used as a mask, phosphorus is ion implanted at a concentration of about $4 \times 10^{15}$ atom/cm$^2$ through the opening of the oxide pattern 64 to the region of the crystalline silicon film 66 containing a high concentration of Ni with an accelerating energy of 15 keV.

Figure 4F:
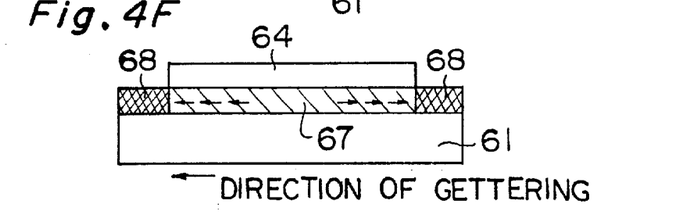

(6) A second heating process is performed at a temperature of 600° C. in a nitrogen atmosphere, by which Ni in a crystalline silicon film 67 is gettered into a phosphorus-implanted region 68 (first gettering process) as shown by arrows in FIG. 4F.

Figure 4G:
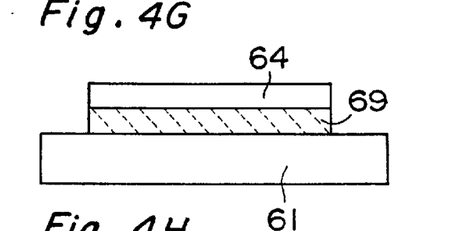

(7) As shown in FIG. 4G, with the oxide pattern 64 used as a mask, the first gettering region, i.e., the region 68 of the crystalline silicon film where high-concentration Ni is contained is removed by dry etching process.

Figure 4H:
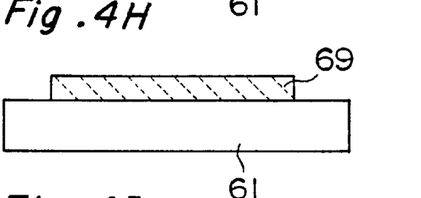

(8) As shown in FIG. 4H, the oxide pattern 64 on the surface of a crystalline silicon film 69 is removed by buffered hydrofluoric acid, and a third heating process is performed at a temperature of 950° C. in an $O_2$ atmosphere. Then, Ni in the crystalline silicon film 69 is gettered into resulting oxide 70 as shown by arrows in FIG. 4I (second gettering process). When this second gettering process is performed in an atmosphere in which HCl has been added to $O_2$, a higher Ni reduction effect can be obtained. Further, a crystalline silicon film which is smaller in surface irregularities, smoother and freer from pinholes can be obtained when CVD oxide is deposited before the oxidation.

(9) The oxide 70 on the surface of the crystalline silicon film 69 is removed by using buffered hydrofluoric acid. In this way, a high-quality crystalline silicon film 71, into which Ni has been gettered, is formed as shown in FIG. 4J.

After this on, when an N-channel TFT is fabricated by using the resulting high-quality crystalline silicon film 71, the same procedure as the steps (10)–(18) in the first example may be executed.

(Fifth Example)

In this example, as an example different from the foregoing fourth example with respect to the horizontal growth, a case where the second gettering process is performed by the second method is described. In this example, first, in the same way as the steps (1)–(7) in the fourth example, a crystalline silicon film is grown horizontally on a quartz substrate, followed by ion implantation, and a second heating process is performed, by which the first gettering process is performed, and then the first gettering process region is removed.

(8) The oxide pattern on the crystalline silicon film of the first gettering process is removed by using buffered hydrofluoric acid, and oxide is deposited at a film thickness of 300 Å by low pressure CVD process. Then, further, oxidation is performed at a temperature of 950° C. in an $O_2$ atmosphere so that the film thickness of the oxide finally becomes 600 Å. The second gettering is achieved by the heating process in that process, by which Ni in the crystalline silicon film is incorporated into the oxide.

(9) The oxide on the surface of the crystalline silicon film is removed by using buffered hydrofluoric acid. In this way, a high-quality crystalline silicon film, into which Ni has been gettered, can be obtained.

As described above, in the second gettering according to this example, since the oxidation of the crystalline silicon film is performed via the previously formed oxide, a crystalline silicon film which is smaller in surface irregularities, smoother and freer from pinholes can be obtained as compared with such a case where the oxidation is performed directly on the crystalline silicon film that has undergone the first engage as in the fourth example.

After this on, when an N-channel TFT is fabricated by using the resulting high-quality crystalline silicon film, the same procedure as the steps (10)–(18) in the first example may be executed.

(Sixth Example)

In this example, as an example different from the fourth and fifth examples with respect to the horizontal growth, a case where the first gettering process is performed by the second method and the second gettering process is performed by the first method is described with reference to FIG. 5. In this example, first, in the same way as the steps (1)–(4) in the fourth example, a crystalline silicon film 84 is grown on a quartz substrate 81 horizontally (i.e., in a direction of the amorphous silicon film under an oxide pattern 82) from the region of a crystalline silicon film 83 where Ni is contained at higher concentration, resulting in a state of FIG. 5A.

Figure 5A:
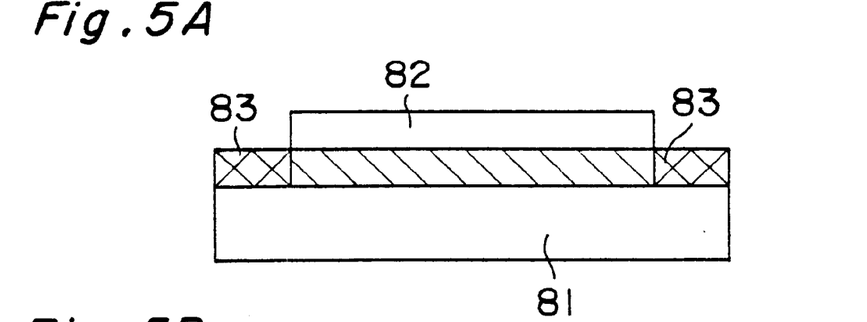
FIGS. 5A to 5D are views showing an example of the second embodiment other than that shown in FIGS. 4A to 4J.
Figure 5B:
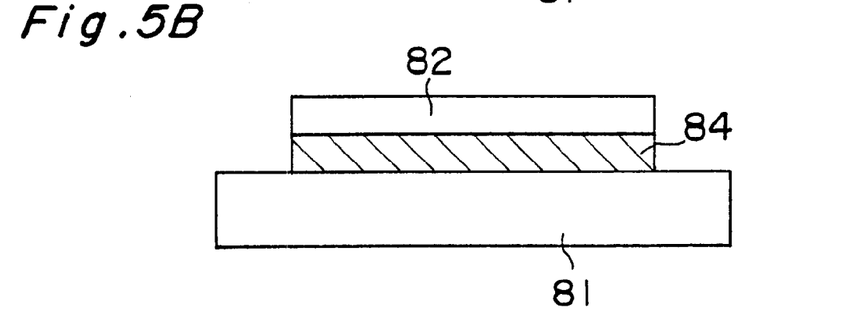

(3) As shown in FIG. 5B, with the oxide pattern 82 used as a mask, the region 83 of the crystalline silicon film containing high-concentration Ni is removed by dry etching process.

Figure 5C:
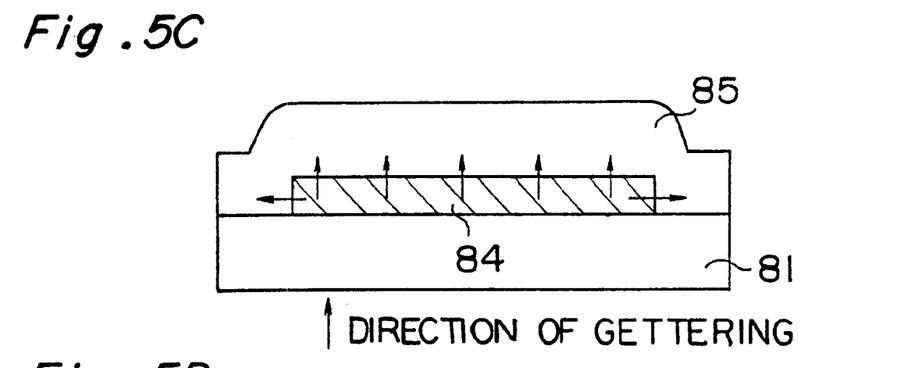

(4) As shown in FIG. 5C, oxide 85 is deposited by CVD process.

(5) A 1 hour second heating process is performed at a temperature of 950° C. in a nitrogen atmosphere, by which Ni in the crystalline silicon film 84 is gettered into the oxide 85 as shown by arrows in FIG. 5C (first gettering process).

Figure 5D:
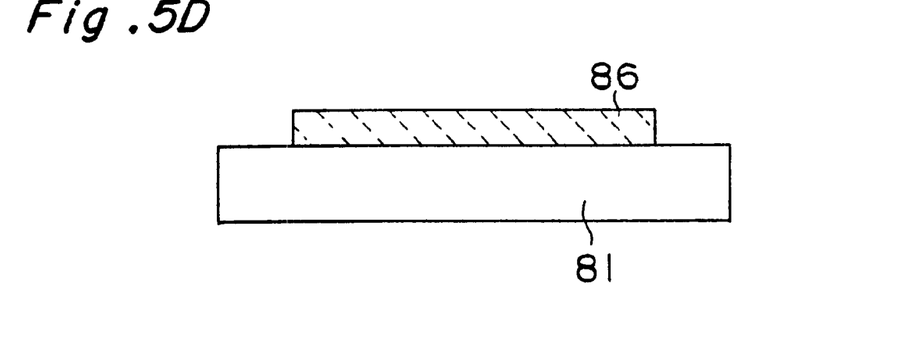

(6) The oxide 85 on the surface of the crystalline silicon film 84 is removed by using buffered hydrofluoric acid. In this way, as shown in FIG. 5D, a crystalline silicon film 86 in which Ni has been gettered by the first gettering is obtained.

After this on, the second gettering process is performed in the same way as the steps (8) and (9) in the fourth example, by which a high-quality crystalline silicon film is obtained. In addition, when an N-channel TFT is fabricated by using the resulting high-quality crystalline silicon film, the same procedure as the steps (10)–(18) in the first example may be executed.

According to this example, since phosphorus is not implanted in the first gettering process, the first gettering process can be simplified as compared with the fourth example. Therefore, according to this example, lower cost, higher productivity and higher yield can be realized.

The invention being thus described, it will be obvious that the same may be varied in many ways. Such variations are not be regarded as a departure from the spirit and scope of the invention, and all such modifications as would be obvious to one skilled in the art are intended to be included within the scope of the following claims.

What is claimed is:

1. A method for fabricating a semiconductor device comprising:

a step for crystallizing an amorphous silicon film to obtain a crystalline silicon film by introducing a metallic element serving for acceleration of crystallization onto the amorphous silicon film, and by performing a first heating process in an non-oxidative atmosphere;

a first gettering step for removing or reducing the metallic element present in at least a partial region of the crystalline silicon film by performing a second heating process in a non-oxidative atmosphere;

a second gettering step for further removing or reducing the metallic element present in the region of the crystalline silicon film where the first gettering has been effected, by performing a third heating process in an oxidative atmosphere; and a step for removing oxide formed by the second gettering step.

2. The method for fabricating a semiconductor device according to claim 1, wherein the metallic element serving for acceleration of crystallization is one kind of metallic element or a plurality of metallic elements selected from among iron, cobalt, nickel, copper, ruthenium, rhodium, palladium, osmium, iridium, platinum and gold.

3. The method for fabricating a semiconductor device according to claim 1, wherein in the first gettering step, one kind of element or a plurality of kinds of elements selected from among nitrogen, phosphorus, arsenic, antimony and bismuth are introduced onto a surface or into film of a region of the crystalline silicon film except the region from which the metallic element is to be removed or reduced, and thereafter the second gettering process is performed in a non-oxidative atmosphere containing an inert gas such as nitrogen, hydrogen, argon and helium, whereby the metallic element is gettered into the element-introductory region.

4. The method for fabricating a semiconductor device according to claim 1, wherein in the first gettering step, oxide is deposited on the surface of the crystalline silicon film, the metallic element is gettered into the oxide by performing the second heating process in a non-oxidative atmosphere containing an inert gas such as nitrogen, hydrogen, argon and helium, and thereafter the oxide is removed.

5. The method for fabricating a semiconductor device according to claim 1, wherein in the first gettering step, oxide is deposited on the surface of the crystalline silicon film, the metallic element is gettered into the oxide by performing the second heating process in a non-oxidative atmosphere containing at least one kind of halogen element selected from among hydrogen chloride, hydrogen fluoride, hydrogen bromide, chlorine, fluorine and bromine, and thereafter the oxide is removed.

6. The method for fabricating a semiconductor device according to claim 1, wherein in the second gettering step, by the third heating process in an oxidative atmosphere, thermal oxide is formed on the surface of the crystalline silicon film and the metallic element present in the region of the crystalline silicon film where the first gettering has been effected is incorporated into the thermal oxide, whereby the metallic element is further gettered.

7. The method for fabricating a semiconductor device according to claim 1, wherein in the second gettering step, oxide is deposited on the surface of the crystalline silicon film, and by the third heating process in an oxidative atmosphere, the metallic element present in the region of the crystalline silicon film where the first gettering has been effected is incorporated into the oxide, whereby the metallic element is further gettered.

8. The method for fabricating a semiconductor device according to claim 6, wherein the oxidative atmosphere in which the third heating process is performed contains at least one kind of halogen element selected from among hydrogen chloride, hydrogen fluoride, hydrogen bromide, chlorine, fluorine and bromine.

9. The method for fabricating a semiconductor device according to claim 6, wherein temperature for the third heating process is 700° C. or higher and 1150° C. or lower.

10. A method for fabricating a semiconductor device comprising:

a step for crystallizing an amorphous silicon film to obtain a crystalline silicon film by introducing a metallic element serving for acceleration of crystallization onto a partial region of the amorphous silicon film, and by performing a first heating process in an non-oxidative atmosphere;

a first gettering step for removing or reducing the metallic element present in a region of the crystalline silicon film except regions of the crystalline silicon film vertically crystallized from the partial region, by performing a second heating process in a non-oxidative atmosphere;

a second gettering step for further removing or reducing the metallic element present in the region of the crystalline silicon film where the first gettering has been effected, by performing a third heating process in an oxidative atmosphere; and a step for removing oxide formed by the second gettering step.

11. The method for fabricating a semiconductor device according to claim 10, wherein the metallic element serving for acceleration of crystallization is one kind of metallic element or a plurality of metallic elements selected from among iron, cobalt, nickel, copper, ruthenium, rhodium, palladium, osmium, iridium, platinum and gold.

12. The method for fabricating a semiconductor device according to claim 10, wherein in the first gettering step, one kind of element or a plurality of kinds of elements selected from among nitrogen, phosphorus, arsenic, antimony and bismuth are introduced onto a surface or into film of a region of the crystalline silicon film including the region into which the metallic element has been introduced, and thereafter the second heating process is performed in a non-oxidative atmosphere containing an inert gas such as nitrogen, hydrogen, argon and helium, whereby the metallic element is gettered into the element-introductory region.

13. The method for fabricating a semiconductor device according to claim 10, wherein in the first gettering step, oxide is deposited on the surface of the crystalline silicon film, the metallic element is gettered into the oxide by performing the second heating process in a non-oxidative atmosphere containing an inert gas such as nitrogen, hydrogen, argon and helium, and thereafter the oxide is removed.

14. The method for fabricating a semiconductor device according to claim 10, wherein in the first gettering step, oxide is deposited on the surface of the crystalline silicon film, the metallic element is gettered into the oxide by performing the second heating process in a non-oxidative atmosphere containing at least one kind of halogen element selected from among hydrogen chloride, hydrogen fluoride, hydrogen bromide, chlorine, fluorine and bromine, and thereafter the oxide is removed.

15. The method for fabricating a semiconductor device according to claim 10, wherein in the second gettering step, by the third heating process in an oxidative atmosphere, thermal oxide is formed on the surface of the crystalline silicon film and the metallic element present in the region of the crystalline silicon film where the first gettering has been effected is incorporated into the thermal oxide, whereby the metallic element is further gettered.

16. The method for fabricating a semiconductor device according to claim 10, wherein in the second gettering step, oxide is deposited on the surface of the crystalline silicon film, and by the third heating process in an oxidative atmosphere, the metallic element present in the region of the crystalline silicon film where the first gettering has been effected is incorporated into the oxide, whereby the metallic element is further gettered.

17. The method for fabricating a semiconductor device according to claim 15, wherein the oxidative atmosphere in which the third heating process is performed contains at least one kind of halogen element selected from among hydrogen chloride, hydrogen fluoride, hydrogen bromide, chlorine, fluorine and bromine.

18. The method for fabricating a semiconductor device according to claim 15, wherein temperature for the third heating process is 700° C. or higher and 1150° C. or lower.

* * * * *